(12) United States Patent
Voronin et al.

(10) Patent No.: US 10,083,820 B2
(45) Date of Patent: Sep. 25, 2018

(54) DUAL-FREQUENCY SURFACE WAVE PLASMA SOURCE

(71) Applicant: Tokyo Electron Limited, Minato-ku, Tokyo (JP)

(72) Inventors: Sergey A. Voronin, Glenmont, NY (US); Jason Marion, Glenville, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/812,047

(22) Filed: Nov. 14, 2017

(65) Prior Publication Data

US 2018/0138018 A1    May 17, 2018

Related U.S. Application Data

(60) Provisional application No. 62/421,515, filed on Nov. 14, 2016.

(51) Int. Cl.
*H01J 37/32* (2006.01)

(52) U.S. Cl.
CPC .. *H01J 37/32302* (2013.01); *H01J 37/32082* (2013.01); *H01J 37/32238* (2013.01); *H01J 37/32293* (2013.01)

(58) Field of Classification Search
None
See application file for complete search history.

(56) References Cited

U.S. PATENT DOCUMENTS

| | | | | |
|---|---|---|---|---|
| 2009/0289179 | A1* | 11/2009 | Chen | H01J 37/32357 250/251 |
| 2011/0057562 | A1* | 3/2011 | Chen | H01J 37/32192 315/39 |
| 2014/0138030 | A1* | 5/2014 | Sawada | C23C 16/45565 156/345.29 |
| 2017/0345619 | A1* | 11/2017 | Ohtake | H01J 37/32082 |

* cited by examiner

*Primary Examiner* — Jany Richardson
(74) *Attorney, Agent, or Firm* — Wood Herron & Evans LLP (57) ABSTRACT

Described herein is a technology related to a method for utilizing a dual-frequency surface wave plasma sources to provide stable ionizations on a plasma processing system. Particularly, the dual-frequency surface wave plasma sources may include a primary surface wave power plasma source and a secondary power plasma source, which is provided on each recess of a plurality of recesses. The secondary power plasma source, for example, may provide the stable ionization on the plasma processing system.

21 Claims, 6 Drawing Sheets

DUAL-FREQUENCY SURFACE WAVE PLASMA SOURCE

BACKGROUND

Fabrication of integrated circuits (IC) in the semiconductor industry typically employs plasma processing to create and assist surface chemistry necessary to remove material from and deposit material to a substrate within a plasma processing chamber. Examples of plasma processing apparatus include a plasma CVD (Chemical Vapor Deposition) apparatus configured to deposit a thin film on a substrate, and a plasma etching apparatus configured to remove material from a substrate, which can include using an etch mask to define locations for removing material.

In general, such plasma processing apparatus form plasma under vacuum conditions by flowing a process gas into a processing chamber. Heated electrons in the plasma can have energy sufficient to sustain dissociative collisions and ionizing. As such, a specific set of gases under predetermined conditions (e.g., chamber pressure, gas flow rate, etc.) may be chosen to produce a population of charged species and/or chemically reactive species. These species may be suitable, for example, to a particular process being performed within the processing chamber.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein is a technology related to a method for utilizing a dual-frequency surface wave plasmasources to provide stable ionizations on a plasma processing system. Particularly, the dual-frequency surface wave plasma sources may include a primary surface wave power plasma source and a secondary powerplasma source that may operate at different powers and frequencies.

For example, the primary surface wave power plasma source and the secondary power plasma source may operate at frequency ranges 400 MHz to 5.0 GHz and 1 MHz to 100 MHz, respectively. Furthermore, the primary surface wave power plasma source may generate up to 5000 watts and the secondary power plasma source may generate up to 100 watts.

As described herein, the plasma processing system may include a plasma source that further includes a radio frequency (RF) microwave source and an electromagnetic wave radiator. In this example, a plurality of recesses or dimples may be formed on a planar surface of the electromagnetic wave radiator. The RF microwave source may provide the primary surface wave power plasma source through the plurality of recesses in order to form a plasma on a plasma region. The formed plasma, for example, may be used for the etching and/or plasma-enhanced deposition processes as described herein.

By utilizing the primary surface wave power plasma source alone i.e., without the secondary powerplasma source, some recesses on the plurality of recesses lack ionization to sustain a stable discharge. As a result, the lack of ionization on some recesses may produce plasma instability and non-uniformity. Non-uniform plasma may be created that results in etch non-uniformity that can cause significant under-etching and over-etching of different parts of the substrate (wafer). For example, the lack of ionization may create an "asymmetric" plasma impedance load resulting in a non-uniform power distribution through the plurality of recesses. In this example, the non-uniform power distribution may cause strong non-uniformity of plasma density that may cause etch non-uniformity and damages to the substrate. Plasma stability and uniformity may be controlled by adjusting particular variables. Such variables include, and are not limited to, plasma density, plasma temperature, etc. Photo or light detection may be implemented in the processing chamber to detect/adjust for such variables. In particular, monitoring light intensity at each recesses of the multiple recesses may be performed. For more details of operation instability detection in a surface wave plasma source, refer to U.S. application Ser. No. 15/416,422, METHOD FOR OPERATION INSTABILITY DETECTION IN A SURFACE WAVE PLASMA SOURCE, by Voronin, et al., filed on Jan. 26, 2017, which is included herein in its entirety by reference.

Accordingly, the secondary powerplasma source may be configured for additional local power delivery in order to provide stable ionizations in the plurality of recesses of the electromagnetic wave radiator of the plasma source. The phrase multiple recesses and plurality of recesses are used interchangeably.

Figure 1:
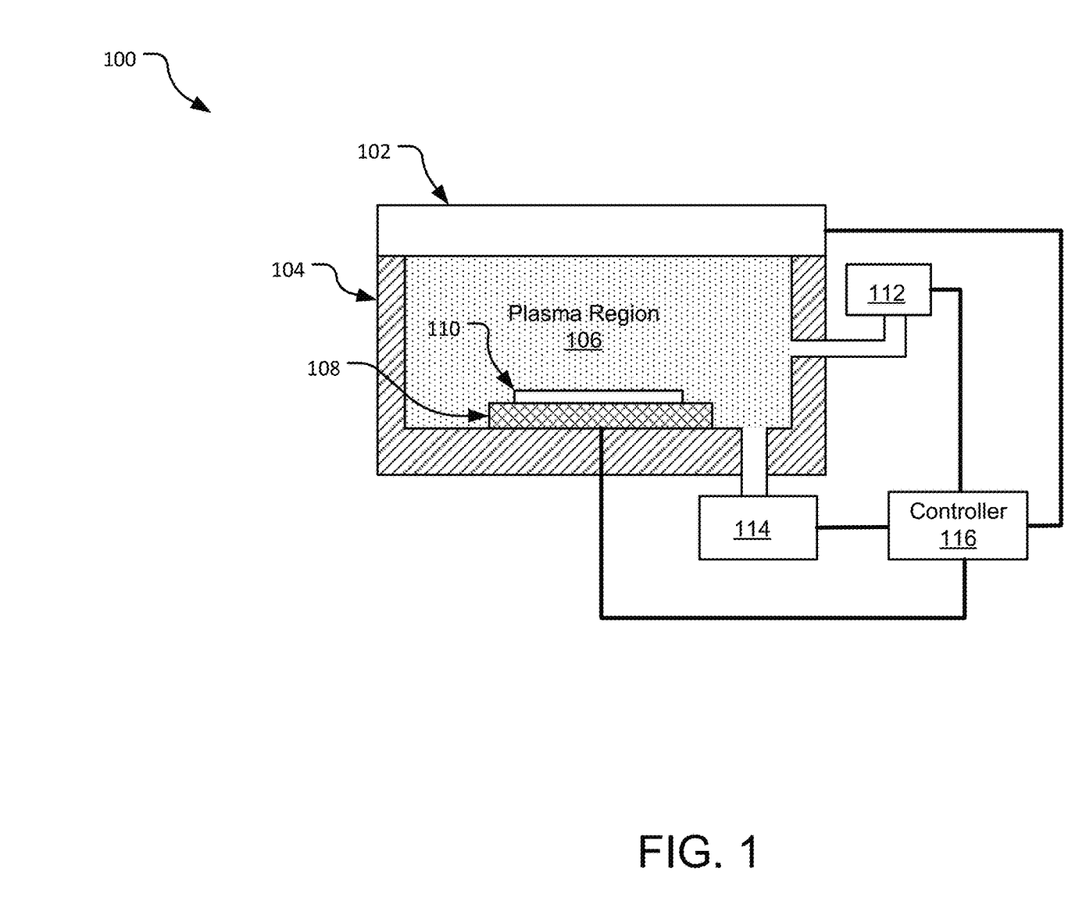
FIG. 1 illustrates an example plasma processing system according to implementations described herein.

FIG. 1 illustrates an example plasma processing system 100 according to implementations described herein. As shown, the plasma processing system 100 may include a plasma source 102, a plasma processing chamber 104, a plasma region 106, a substrate holder 108 holding a substrate 110, a gas supply 112, a pump 114, and a controller 116.

The plasma processing system 100 may include a microwave plasma processing apparatus used to modify chemical and physical properties of a surface such as the surface of the substrate 110. For example, the plasma processing system 100 may be utilized for etching purposes, for a plasma enhanced deposition processes, or the like.

As shown, the processing chamber 104 may enclose the plasma region 106 where the microwave power may be radiated. As described herein, the radiated microwave power on the plasma region 106 may be generated by a primary surface wave power plasma source 102. For example, the primary surface wave plasma power source 102 may be configured to generate a power of about 300 to 5000 watts at 400 MHz to 5.0 GHZ frequency range. In this example, the 300 to 5000 watts at 400 MHz to 5.0 GHZ frequency range may include the primary surface wave power plasma source 102 as described herein.

The processing chamber 104 may further include the substrate holder 108 that may support the substrate 110 within the plasma region 106. The substrate 110 may have a variety of substrate configurations. For example, the substrate 110 may have a SOI (silicon-on-insulator) substrate configuration where semiconductor devices may be formed in and above an active layer of the SOI substrate. In another example, the substrate 110 may be made of silicon or of materials other than silicon.

The substrate 110 may be subjected to the etching, the plasma enhanced deposition processes, or the like. In this regard, the substrate 110 may be exposed to the plasma, a process chemistry, or a combination of both, on the plasma region 106.

The plasma source 102 may be configured to radiate electromagnetic waves in order to energize the plasma region 106. For example, the plasma source 102 may be a surface-wave plasma (SWP) source that may include radial line slot antenna. In this example, the radial line slot antenna (not shown) may include slot plates with plurality of slots, and dielectric plate, to facilitate radiation of electromagnetic waves into the plasma region 106 as further discussed below.

During the operation of the plasma processing system 110, the processing chamber 104 may receive gas supply from the gas supply system 112. For example, the gas supply system 112 may supply inert gas, etchant gas, or a combination thereof. To perform plasma etching, for example, the gas supply system 112 may supply oxygen, carbon dioxide, fluorocarbon-based or halogen-based chemistry, and/or a combination thereof. It is to be understood that other chemicals and gases may be implemented.

The plasma processing system 110 may further include a pump 114 that may be configured, for example, to control pressure within the processing chamber 104. The pump 114 may be coupled to the controller 116 that may be configured to control and organize steps for the etching and plasma enhanced deposition processes.

In an implementation, the plasma source 102 may be configured to include a secondary power plasma source. For example, as further discussed below, the plasma source 102 may include a low power plasma source that is independent of the primary surface wave power plasma source. In this example, the low-power plasma source may operate at a different frequency and power wattages as compared to the primary surface wave power plasma source. Furthermore, the low-power plasma source may be configured to stabilize ionization on each recess of the plurality of recesses (not shown) of the plasma source 102.

As described herein, the low-power plasma source may operate at 1 MHz to 100 MHz to supply up to 100 watts of power per recess of the plurality of recesses on a plasma surface of the plasma source 102. For example, the low-power plasma source may compensate for non-uniform ionization on each recess in the plurality of recesses. In this example, the low-power plasma source may provide plasma stability on the plasma region 106 as further discussed below.

Figure 2:
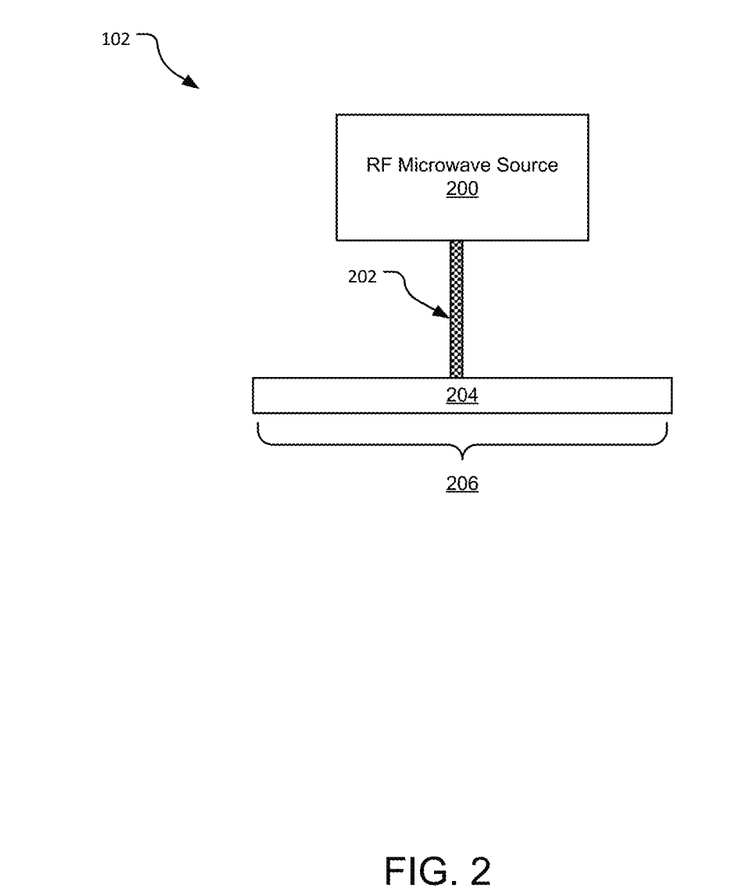
FIG. 2 illustrates an example schematic representation of a surface-wave plasma (SWP) source as described herein.

FIG. 2 illustrates an example schematic representation of a surface-wave plasma (SWP) source as described herein. Particularly, FIG. 2 shows a schematic representation of the plasma source 102, which may be an example of the SWP source. As shown, the plasma source 102 may include radio frequency (RF) microwave source 200, a waveguide 202, and an electromagnetic wave radiator 204 with a plasma surface 206.

The electromagnetic wave radiator 204 may include the radial line slot antenna to generate electromagnetic waves on the plasma region 106 through the plasma surface 206 (i.e., dielectric window). The generated electromagnetic waves, for example, may be used to form plasma for etching or plasma enhanced deposition processes on the plasma processing system 100.

The plasma source 102 may further include the RF microwave source 200 that may generate electromagnetic wave energy which is supplied to the electromagnetic wave radiator 204 through the waveguide 202. Referring back to FIG. 1, the generated electromagnetic wave energy, for example, may include the primary surface wave power plasma source 102. In this example, the generated electromagnetic wave energy may include a power of about 300 to 5000 watts at 400 MHz to 5.0 GHZ frequency range.

Figure 3:
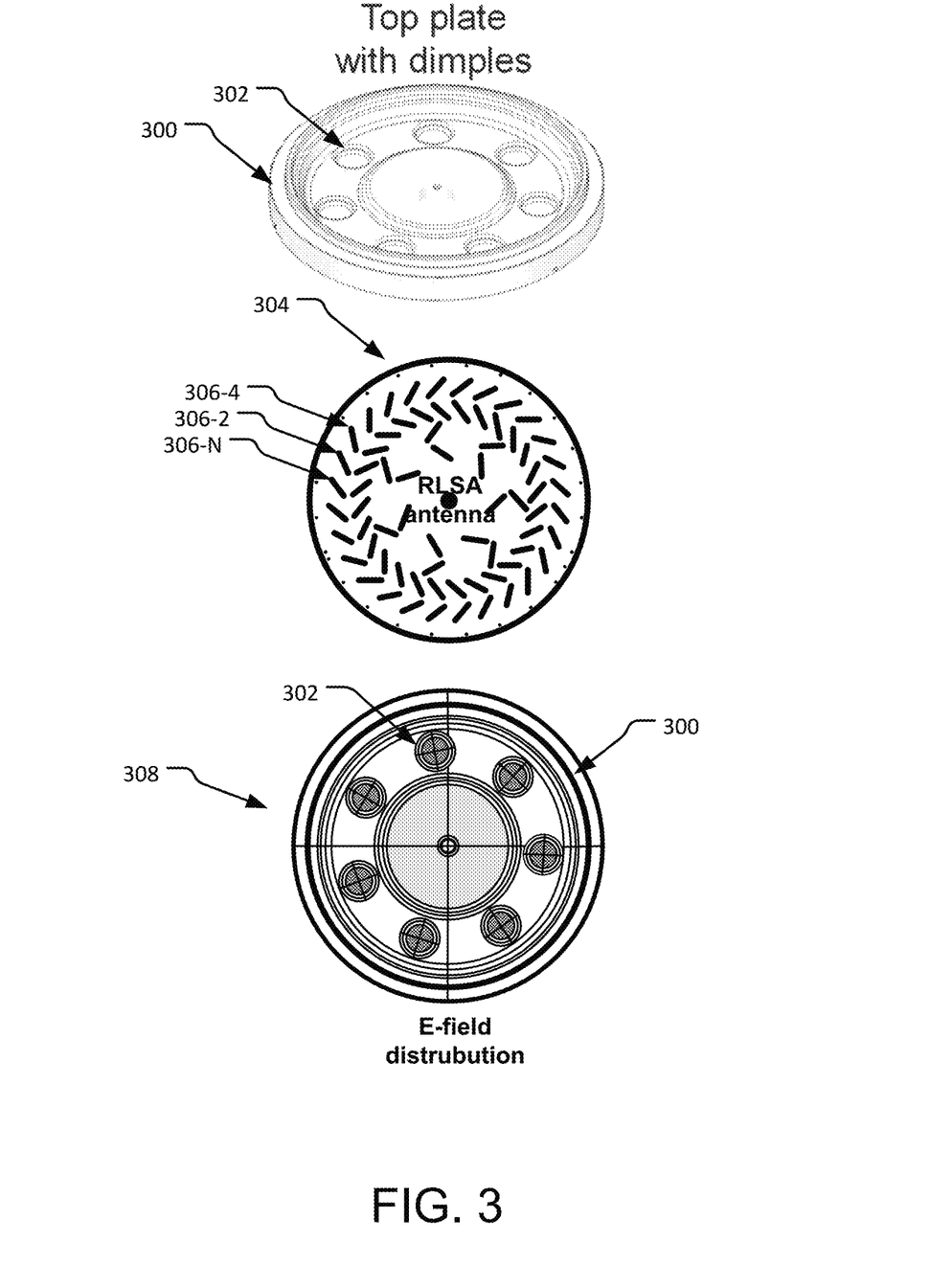
FIG. 3 illustrates an example implementation of an electromagnetic wave radiator as described herein.

FIG. 3 illustrates an example implementation of the electromagnetic wave radiator 204 as described above in reference to FIG. 2. In particular, FIG. 3 shows the electromagnetic wave radiator 204 to include a resonator plate 300 with a plurality of recesses 302, and a radial line slot antenna 304 with a plurality of slots 306-2 to 306-N where "N" is an integer number. As described herein, the use of the primary surface wave plasma power source 102 of FIG. 1 and the secondary power plasma source may generate uniform electric fields on the plurality of recesses 302 as represented by electric field (E-field) distribution 308.

The resonator plate 300 may include a dielectric plate that is disposed along the planar surface 206 of the electromagnetic wave radiator 204 as shown in FIG. 2. As depicted, the resonator plate 300 may be a bottom view of the electromagnetic wave radiator 204 of FIG. 2 where the resonator plate 300 is disposed facing the formed plasma on the plasma region 106 of FIG. 1.

The plurality of recesses 302 may be formed, for certain implementations, on a planar surface of the resonator plate 300. In other implementations, the surface of the resonator plate 300 may be non-planar.

Each recess of the plurality of recesses 302 may include a hollow indentation to form a recess or dimple on the planar or non-planar surface shape of the resonator plate 300. For example, the formed recess or dimple may include a cylindrical shape. In this example, each formed recess or dimple may be characterized by length, width, and/or depth.

The waveguide 202 of FIG. 2, may include the radial line slot antenna 304 that may be disposed in between the resonator plate 300 and a feeding point (not shown) of the electromagnetic wave radiator 204 of FIG. 2. Furthermore, the waveguide 202 of FIG. 2 may feed electromagnetic energy to the radial line slot antenna 304.

In an implementation, each recess on the plurality of recesses 302 may be provided with a secondary power plasma source. For example, the low-power plasma source (not shown) may be coupled to the plurality of recesses 302 to provide the low RF plasma power. In this example, the distribution or discharge of plasma power in each recess of the plurality of recesses 302 is uniform and the plasma discharge stability is sustained.

Referencing the field distribution 308, the presence of the secondary surface wave plasma source on each recess of the plurality of recesses 302 may provide effective and stable ionization on all dimples or recesses of the dielectric resonator plate 300. That is, the presence of the primary surface wave power plasma source 102 of FIG. 1 (i.e., high-power microwave plasma source) alone and without the secondary low RF plasma source may generate unstable electric fields in some recesses of the plurality of recesses 302.

Figure 4:
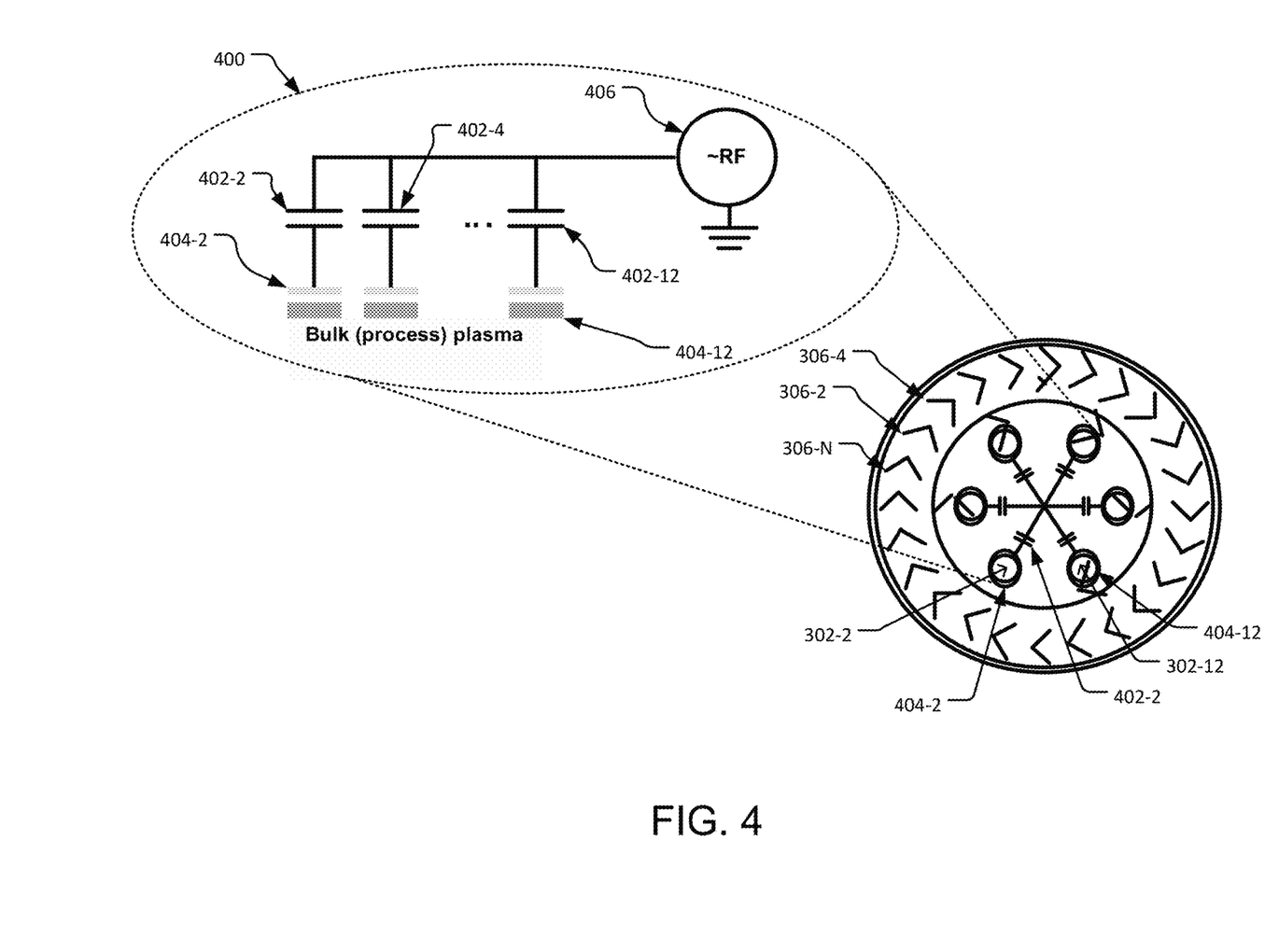
FIG. 4 illustrates an example secondary power plasma source that may be deployed on each recess of a plurality of recesses as described herein.

FIG. 4 illustrates an example secondary power plasma source that may be deployed on each recess of the plurality of recesses as described herein. As shown, a schematic graph 400 may depict a low RF and power plasma source with capacitive ballast loads 402 (i.e., 402-2, 402-4 . . . , 402-12), cathodes 404 (i.e., 404-2, 404-4 . . . , 404-12), and an RF source 406. In certain implementations, other methods may be used for power distribution. Cathodes 404 may be implemented as "rings" or cathode rings. As described herein, the depicted low-power plasma source of the schematic graph 400 may be deployed or implemented on each recess of the plurality of recesses 302 as shown in FIG. 3, in order to provide effective and uniform ionization on all recesses of the dielectric resonator plate 300 as shown in FIG. 3.

In an implementation, the low-power plasma source may provide plasma uniformity and plasma stability on each recess of the plurality of recesses 302 of FIG. 3. For example, the low-power plasma source may include a capacitive ballast load 402 placed in series with a cathode 404. In this example, the capacitive ballast load 402 may include one or more capacitors that may be configured to receive power from the RF source 406.

During plasma operations, each capacitive ballast load 402 may facilitate activation of the secondary power plasma source to maintain plasma uniformity and stability on corresponding recess of the plurality of recesses 302.

For example, the capacitive ballast load 402-2 may supply a discharge or electromagnetic waves to the cathode 404-2 that is disposed and wrapped around on recess 302-2 of the plurality of recesses 302 of FIG. 3. That is, the capacitive ballast load 402-2 may deliver power to the recess 302-2 of FIG. 3 through the cathode 404-2. In this example, the cathode 404-2 may be wrapped around the recess 302-2 of FIG. 3. In this example still, the cathode 404-2 may receive and supply the received secondary power plasma source from the capacitive ballast load 402-2 to the recess 302-2 of the plurality of recesses 302 of FIG. 3.

Referring to FIG. 4, in the foregoing example, the recess 302-2 may receive a power of up to 100 watts, which is enough to sustain effective ionization in each recess of the plurality of recesses 302. As compared to the primary surface wave power plasma source, the primary surface wave power plasma source may provide about 300 to 5000 watts per recess of the plurality of recesses 302. However, as described above, the primary surface wave power plasma source may generate unstable electric fields on some of the plurality of recesses 302 that may cause severe ion density non-uniformity on the plasma region 106 shown in FIG. 1.

In an implementation, the primary surface wave power plasma source may operate from 400 MHz to 5.0 GHZ, while the secondary power plasma source may operate at 1 MHz to 100 MHz. This dual-frequency surface wave plasma source may provide efficient etching and plasma enhanced deposition processes by the plasma processing system 100 of FIG. 1. The primary power surface wave power source may be considered as a first plasma ionization source, and the secondary power plasma source may be considered as second plasma ionization sources.

Figure 5:
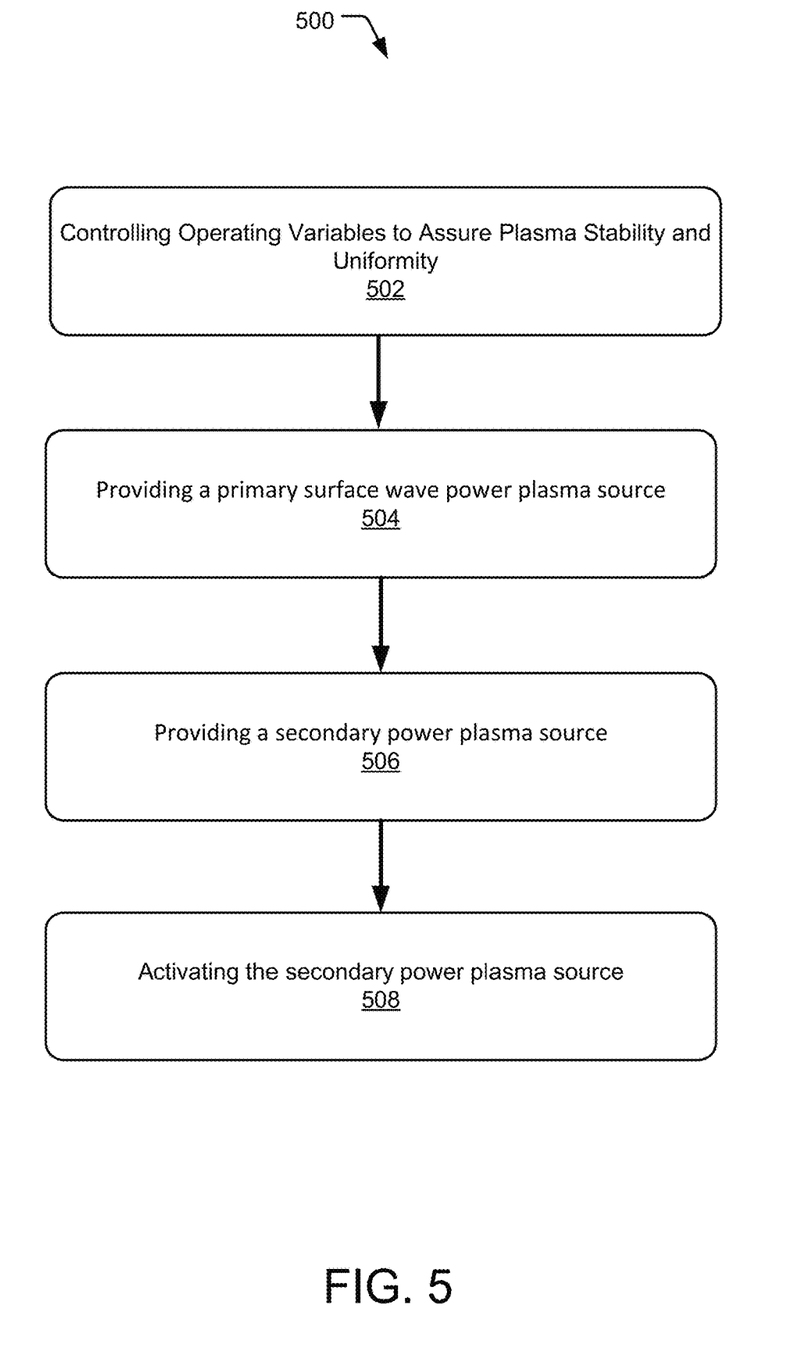
FIG. 5 illustrates an example process chart illustrating an example method for a dual-frequency surface wave plasma source as described herein.

FIG. 5 shows an example process chart 500 illustrating an example method for a dual-frequency surface wave plasma source as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, controlling may be performed to assure plasma stability and uniformity. The controlling is described above. If measured variables are in a determined range, then process 500 may proceed.

At block 504, providing a primary surface wave power plasma source over a surface of a dielectric plate that includes multiple recesses is performed. For example, the primary surface wave power source 102 of FIG. 1 may include the RF microwave source 200 of FIG. 2, and the electromagnetic wave radiator 204 of FIG. 2. In further reference to FIG. 2, this example, the RF microwave source 200 may provide the first primary surface power plasma source to the plasma surface 206 of the electromagnetic wave radiator 204. The RF microwave source 200 may be referred to as a first plasma ionization source that provides a surface wave plasma power on the electromagnetic wave radiator 204.

As described herein, the RF microwave source 200 may operate at a frequency of about 400 MHz to 5.0 GHZ 300 to generate bout 5000 watts.

Referring back to FIG. 5, at block 506, providing a secondary power plasma source at each of the multiple recesses is performed. For example, the low RF plasma power source or lower power plasma source, also considered as a plasma ionization source, as depicted 400 of FIG. 2 may provide the secondary power plasma source on each of the plurality of recesses 302 of FIG. 3. In this example, the low-power plasma source may include the capacitive ballast load 402 that is placed in series with the cathode ring 404. In this example still, the low-power plasma source may be configured to operate independently of the RF microwave source 200 of FIG. 2, which provides the primary surface power plasma source.

The low-power plasma source may sometimes be referred to as multiple plasma ionization sources that may be disposed on each recess of the plurality of recesses 302 of FIG. 3.

At block 508, activating the secondary power plasma source with a capacitive ballast load is performed. As mentioned above, other methods and devices may be used for power distribution. Now referring to FIG. 4, in different implementations, discharge can be performed by any of the described sources. For example, the capacitive ballast load 402 may be utilized to activate the secondary power plasma source. In this example, the capacitive ballast load 402 may include one or more capacitors that may be configured to receive power from the RF source 406. In this example still, the secondary power plasma source is activated to provide a stable ionization over the dielectric plate or the resonator plate 300 of the electromagnetic wave radiator 204. Furthermore, the capacitive ballast load 402 activate the secondary power plasma source when a voltage threshold on each recess is reached.

For example, the voltage threshold may be predefined to include a minimum amount of electric field energy on each recess of the plurality of recesses 302 of FIG. 3. In this example, when the voltage threshold is reached, the capacitive ballast load 402 may activate the secondary power plasma source.

Figure 6:
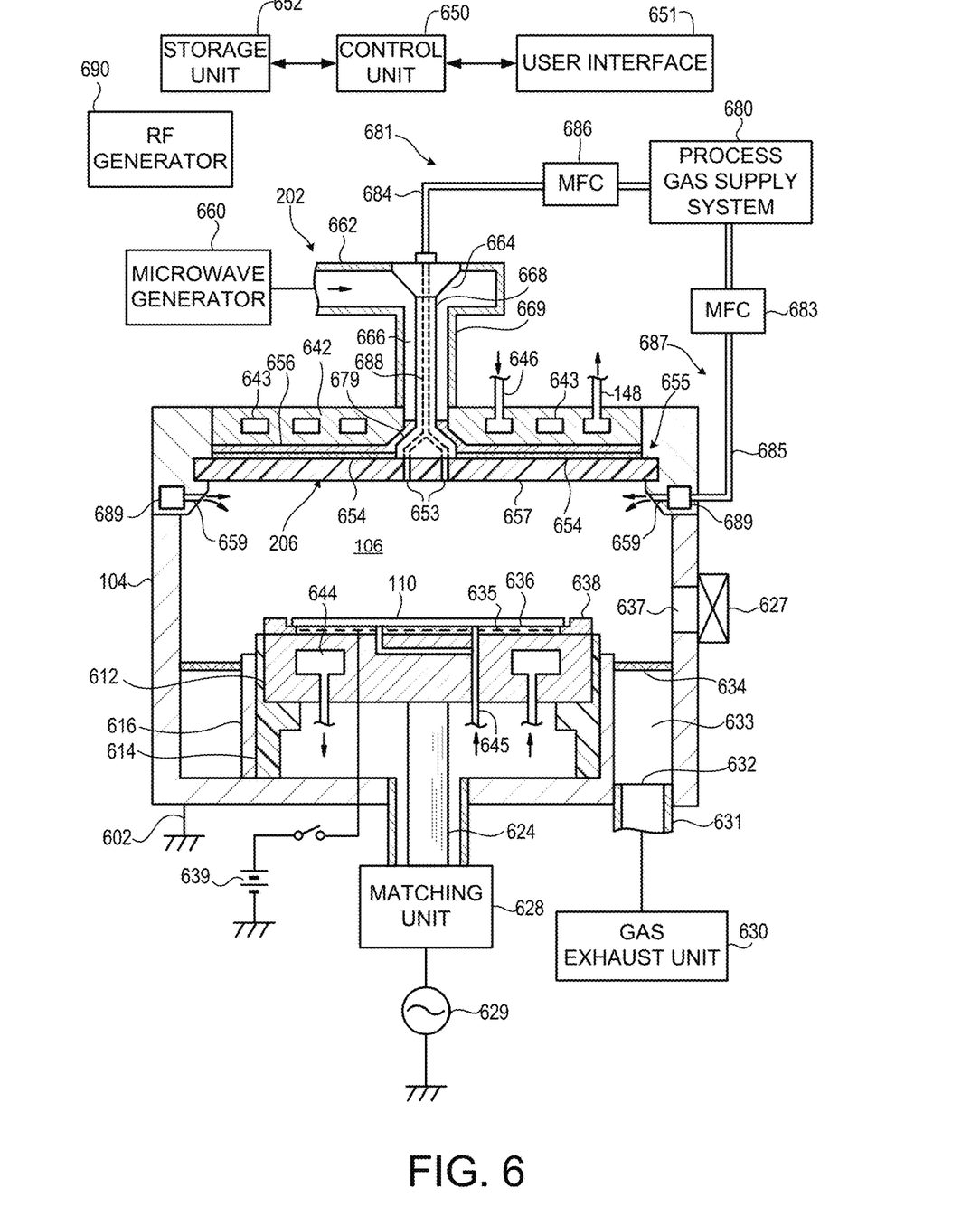
FIG. 6 illustrates an example schematic cross-sectional view of a microwave plasma processing apparatus as described herein.

FIG. 6 is a schematic cross-sectional view of a microwave plasma processing apparatus in accordance with embodiments herein. Particularly, FIG. 6 includes an implementation of FIG. 1 described above.

The microwave plasma processing apparatus can be configured to perform plasma processing such as, for example, the plasma etching, plasma chemical vapor deposition (CVD), plasma atomic layer deposition (ALD), etc., under surface wave plasma excited using microwaves and a flat, plate-type slot antenna. Plasma processing can be executed within the processing chamber 104, which can be a cylindrical vacuum chamber made of a metal such as aluminum or stainless steel. The processing chamber 104 is grounded such as by ground wire 602. The processing chamber 104 defines a processing vessel providing a plasma region 106 for plasma generation. An inner wall of the processing vessel can be coated with alumina, yttria, or other protectant.

At a lower, central area within the processing chamber 104, a susceptor 612 (which can be disc-shaped) can serve as a mounting table on which, for example, the substrate 110 to be processed (such as a semiconductor wafer) can be mounted. Substrate 110 can be moved into the processing chamber 104 through loading/unloading port 637 and gate valve 627. An electrostatic chuck 636 is provided on a top surface of the susceptor 612. Electrode 635 is electrically connected to DC power source 639 (direct current power source). The electrostatic chuck 636 attracts the substrate 110 thereto via an electrostatic force generated when DC voltage from the DC power source 639 is applied to the electrode 635 so that substrate 110 is securely mounted on the susceptor 612. A high-frequency power source 629 for RF bias is electrically connected to the susceptor 612 or bias electrode through a matching unit 628 (to match impedance) and a power feeding rod 624. The high-frequency power source 629 outputs high frequency waves of a frequency suitable for controlling the energy of ions drawn into the substrate 110. For example, high frequency waves of 13.56 MHz or other power can be used for attracting ions. A focus ring 638 is provided radially outside the electrostatic chuck 636 to annually surround the substrate 110.

A coolant flow path 644 can extend, for example, in a circumferential direction, within susceptor 612 and can be configured to receive circulated coolant to help control a processing temperature of substrate 110 on the electrostatic chuck 636. Additionally, heat transfer gas from a heat transfer gas supply unit (not illustrated) can be supplied to a space between a top surface of the electrostatic chuck 636 and a rear surface of the substrate 110 through a gas supply line 645.

An exhaust path 633 can be formed along an outer periphery of support unit 614 and/or conductive support unit 616 and an inner wall of the processing chamber 104 in which an annular baffle plate 634 is attached to the top or inlet of the exhaust path 633 and an exhaust port 632 (or multiple exhaust ports), which is provided in a bottom portion of the exhaust path 633. A gas exhaust unit 630 is connected to each exhaust port 632 through gas exhaust line 631, which can have multiple exhaust lines. The gas exhaust unit 630 can include a vacuum pump such as a turbo molecular pump configured to decompress the plasma processing space within the processing chamber 104 to a desired vacuum condition.

An upper portion of the microwave plasma processing apparatus will now be described. A dielectric window 657 (or the plasma surface 206) can be configured to introduce microwaves and function as a ceiling plate. A space just below the dielectric window 657 within the processing chamber 104 serves as a plasma generation space i.e., plasma region 106. The dielectric window 657 can be made of a microwave-permeable dielectric material such as, for example, quartz or ceramics such as aluminum oxide, and can have a thickness of, for example, about 20 mm or sufficient for pressure resistance. The dielectric window 657 can be provided with a slot plate 654 which can be a conductor attached to, or disposed on, a top surface of the dielectric window 657. The slot plate 654 can have a plurality of slot pairs 306 (not shown) that are configured to irradiate microwaves distributed concentrically in a rotationally symmetric arrangement, though other geometric configurations can be used. On the slot plate 654, a dielectric plate 656 can shorten the wavelength of microwaves propagated inside the slot plate 654. The slot plate 654 is electromagnetically coupled to a microwave transmission line 202. A slot antenna 655, which can be a flat plate-type slot antenna, for example, or a disc-shaped, radial line slot antenna, can include the slot plate 654, the dielectric plate 656, and an antenna rear plate (not shown) provided to be opposite to the slot plate 654. In one embodiment, the dielectric plate 656 has a plurality of recesses (not shown) similar to those described in FIG. 3. In the embodiment, the dielectric plate 656 is coupled to the RF generator 690 which provide low RF plasma power through each of the plurality of recesses.

The microwave transmission line 202 is a line configured to transmit, for example, microwaves of 2.45 GHz (or other frequency), which are output from a microwave generator 660 (i.e., RF microwave source 200) with a predetermined power, to the slot antenna 655, and can include a waveguide 662, a waveguide-coaxial line converter 664, and a coaxial tube 666. The waveguide 662 can be, for example, a rectangular waveguide configured to transmit microwaves from the microwave generator 660 to the waveguide-coaxial line converter 664. The coaxial tube 666 extends vertically downward from the waveguide-coaxial line converter 664 to the central portion of the top of the processing chamber 104 and a terminal end of the coaxial tube 666 is coupled to the slot antenna 655 through the dielectric plate 656. An outer conductor 669 and an inner conductor 668 can define a space for wave transmission. A connector unit 679 is connected to the lower end of the inner conductor 668.

In addition, the microwaves expanded in a radial direction while being shortened in wavelength within the dielectric plate 656 become plane waves of circular polarization having two orthogonal polarization components from each slot pair of the slot antenna 655 and are radiated toward the inside of the processing chamber 104. Process gas in the vicinity of the surface of the dielectric window 657 is then ionized by the electric fields of surface waves (microwave electric fields) propagated in the radial direction along the surface of the dielectric window 657 and, as a result, high-density and low-electronic temperature plasma is generated.

The dielectric plate 656 can include a cooling jacket plate 642, which can serve as an antenna rear plate to cover a top of the processing chamber 104. The cooling jacket plate 642 can be configured to absorb heat (radiating) of dielectric loss which is generated from the dielectric window 657 and the dielectric plate 656. To provide cooling, a coolant can be circulated in a flow path 643, and fed and re a roved through conduit 646 and conduit 648.

The microwave plasma processing apparatus can include two routes for process gas introduction. Upper gas introduction section 681 includes a gas flow path provided in the dielectric window 657, and a side gas introduction section 687 that includes a gas flow path provided in a side wall of the processing chamber 104, as a gas introduction mechanism configured to introduce a processing gas into the processing chamber 104.

In the upper gas introduction section 681, a gas flow path 688 is provided in the inner conductor 668 of the coaxial tube 666 to extend in an axial direction through the inside of the inner conductor 668. Additionally, a first gas supply line 684 from a process gas supply system 680 is connected to the upper end of the inner conductor 668 and the gas flow path 688 of the first gas supply line 684. The connector unit 679 can have a plurality of internal flow paths which are bored and radially branched from a common inlet. The connector unit 679 can be made of a conductor, and can be electrically grounded. The dielectric window 657 can be formed with inner flow paths connected to the terminal ends of a branched gas supply paths such as for process gas to vertically pass through the dielectric window 657 to face the plasma generation space within the processing chamber 104.

In the upper gas introduction section 681, a processing gas, which is pumped from the process gas supply system 680 at a predetermined pressure (for example, an etching gas or a film-forming gas), flows through the first gas supply line 684, the gas flow path 688 of the coaxial tube 666, and is ejected from each gas jet port 653 at the terminal end. A mass flow controller (MFC) 686 and corresponding valve can be used for opening/closing and metering process gas flow in first gas supply line 684.

The side gas introduction section 687 is placed at a position lower than a bottom surface of the dielectric window 657, and can include a buffer chamber 689 (manifold), sidewall gas jet ports 659, and a second gas supply line 685 extending from the process gas supply system 680 to the buffer chamber 689. A mass flow controller 683 and corresponding valve can be used for opening/closing and metering process gas flow in second gas supply line 685. Process gas from side gas introduction section 687 can be jetted in a substantially horizontal flow from the respective sidewall gas jet ports 659 to be diffused in the process space PS. An RF generator 690 may be included with particular interfaces connections to the other components of the microwave plasma processing apparatus. The microwave generator 660 and the RF generator 690 may have active control. In particular, power may be measured at the microwave generator 660 and RF generator to assure that power does not fall below 1000 watts.

Components of the plasma processing apparatus can be connected to, and controlled by, a control unit 650, which in turn can be connected to a corresponding storage unit 652 and user interface 651. Control unit 650 can include a microcomputer configured to control operation of each of the components within the microwave plasma processing apparatus such as, for example, the gas exhaust unit 630, the high-frequency power source 629, DC power source 639 for the electrostatic chuck 636, microwave generator 660, the upper gas introduction section 681, the side gas introduction section 687, the process gas supply system 680, and a heat transfer gas supply unit (not illustrated) or the operations of the entire apparatus. Various plasma processing operations can be executed via the user interface 651, and various plasma processing recipes and operations can be stored in the storage unit 652. Accordingly, a given substrate can be processed within the plasma processing chamber with various microfabrication techniques.

What is claimed is:

1. A method of semiconductor fabrication comprising:
   providing a primary surface wave power plasma source over a surface of a dielectric plate that includes multiple recesses; and
   providing a secondary power plasma source at each of the multiple recesses, wherein the secondary power plasma source is activated to provide a stable ionization over the dielectric plate.

2. The method of claim 1, wherein the primary surface wave power source and the secondary power plasma source are operating at different frequencies.

3. The method of claim 1, wherein the primary surface wave power plasma source operates from 400 MHz to 5.0 GHZ, and the secondary power plasma source operate at 1 MHz to 100 MHz.

4. The method of claim 1, wherein the secondary power plasma source is a radio frequency source.

5. The method of claim 1, wherein the primary surface wave power plasma source provides 300 to 5000 watts.

6. The method of claim 1, wherein the secondary power plasma source provide up to 100 watts per recess.

7. The method of claim 1, wherein the secondary power plasma source is activated by a capacitive ballast load.

8. The method of claim 1 further comprising performing a controlling step to assure plasma stability and/or uniformity.

9. A device for semiconductor fabrication comprising:
   a dielectric plate with a plurality of recesses;
   a first plasma ionization source that provides a surface wave plasma power source over the dielectric plate; and
   secondary plasma ionization sources located and wrapped around each of the plurality of recesses to adjust for a stable plasma ionization over the dielectric plate.

10. The device of claim 9, wherein the first plasma ionization source is a microwave power source.

11. The device of claim 9, wherein the secondary plasma ionization sources are radio frequency (RF) power sources.

12. The device of claim 9, wherein the first plasma ionization source operates from 400 MHz to 5000 GHZ, and the secondary power plasma source operate at 1 MHz to 100 MHz.

13. The device of claim 9, wherein the first plasma ionization source provides up to 5000 watts and the secondary plasma ionization sources provide up to 100 watts per recess.

14. The device of claim 9, further comprising a controller configured to control operating variables to assure plasma stability and uniformity.

15. The device of claim 9, wherein the secondary plasma ionization sources include a capacitive ballast load that activates a discharge when a voltage threshold is reached at a respective recess.

16. The device of claim 9, wherein the secondary plasma ionization sources include a cathode that is discharged to adjust for the stable plasma ionization.

17. A plasma processing system comprising:
   a dielectric plate with a plurality of recesses;
   a plasma ionization source that provides a low-power plasma source to each recess of the plurality of recesses, the plasma ionization source includes:
      a cathode ring that supplies a low power to the each recess of the plurality of recesses; and
      a capacitive ballast load coupled to the cathode ring, the capacitive ballast load activates the plasma ionization source.

18. The plasma processing system of claim 17, wherein the low-power plasma source operates at 1 MHz to 100 MHz.

19. The plasma processing system of claim 17, wherein the low-power plasma source provides up to 100 watts per recess.

20. The plasma processing system of claim 17, wherein the each cathode ring is wrapped around a corresponding recess of the plurality of recesses.

21. The plasma processing system of claim 17, wherein the capacitive ballast load activates the plasma ionization source when a voltage threshold is reached on the recess of the plurality of recesses.

* * * * *